(12) United States Patent
Nonaka et al.

(10) Patent No.: US 7,449,734 B2
(45) Date of Patent: Nov. 11, 2008

(54) JUNCTION SEMICONDUCTOR DEVICE AND METHOD FOR MANUFACTURING THE SAME

(75) Inventors: Ken-ichi Nonaka, Wako (JP); Hideki Hashimoto, Wako (JP); Seiichi Yokoyama, Wako (JP); Kensuke Iwanaga, Wako (JP); Yoshimitsu Saito, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 170 days.

(21) Appl. No.: 11/386,850

(22) Filed: Mar. 23, 2006

(65) Prior Publication Data

US 2006/0214200 A1 Sep. 28, 2006

(30) Foreign Application Priority Data

Mar. 23, 2005 (JP) ............................ P2005-084693

(51) Int. Cl.
   H01L 29/76 (2006.01)
   H01L 29/94 (2006.01)
   H01L 31/062 (2006.01)
   H01L 31/119 (2006.01)

(52) U.S. Cl. ..................... 257/288; 257/213; 257/347; 257/352; 257/E21.17; 257/E21.051; 257/E21.123; 257/E21.218; 257/E21.229; 257/E21.416

(58) Field of Classification Search ................. 257/288, 257/205, 213, 352, 347, 401, 760
See application file for complete search history.

(56) References Cited

U.S. PATENT DOCUMENTS

| | | | | |
|---|---|---|---|---|
| 4,300,150 A | * | 11/1981 | Colak | 357/23 |
| 4,422,089 A | * | 12/1983 | Vaes et al. | 357/22 |
| 4,626,879 A | * | 12/1986 | Colak | 257/336 |
| 5,541,426 A | * | 7/1996 | Abe et al. | 257/170 |
| 2004/0135178 A1 | | 7/2004 | Onose et al. | |
| 2005/0029557 A1 | | 2/2005 | Hatakeyama et al. | |

OTHER PUBLICATIONS

2002 Report on the Results of Research, New Energy and Industrial Technology Development Organization, Development of Ultra Low Loss Power Devices Technology, and Device Design Technology, Research and Development Association for Future Electron Devices.
J. H. Zhao et al., 6A, 1kV 4H-SIC Normally-off Trenched-and-Implanted Vertical JFETs, Materials Science Forum, 2004, 1213-1216, 157-160, Trans Tech Publications, Switzerland.
Takahashi Shinohe et al., 600V5A 4H-SiC with Low $R_{on}S$ of $13m\Omega cm^2$, Proceedings of the Symposium on Static Induction Devices, 2002, 41-45, 17.

* cited by examiner

*Primary Examiner*—David Nhu
(74) *Attorney, Agent, or Firm*—Birch, Stewart, Kolasch & Birch, LLP

(57) ABSTRACT

A junction semiconductor device having a drain region including a low-resistance layer of a first conductive type formed on one surface of a semiconductor crystal, a source region including a low-resistance layer of a first conductive type formed on the other surface of the semiconductor crystal, a gate region of a second conductive type formed on the periphery of the source region, a high-resistance layer of a first conductive type between the source region and the drain region, and a recombination-inhibiting semiconductor layer of a second conductive type provided in the vicinity of the surface of the semiconductor crystal between the gate region and the source region.

7 Claims, 11 Drawing Sheets

PRIOR ART

FIG.13A

PRIOR ART

FIG.13B

PRIOR ART

JUNCTION SEMICONDUCTOR DEVICE AND METHOD FOR MANUFACTURING THE SAME

FIELD OF THE INVENTION

The present invention relates to a junction semiconductor device and a method for manufacturing a junction semiconductor device, and more specifically relates to static induction transistors and other junction semiconductor devices and to a method for manufacturing a junction semiconductor device that is suitable for inhibiting recombination of electrons from the source region and positive holes from the gate region.

BACKGROUND OF THE INVENTION

Semiconductor silicon carbide (SiC) has considerable bandgap energy in comparison with silicon that is widely used in devices, and is suitable for high voltage, high power, and high temperature operation. There are high expectations for its application to power devices and other components. The structure of SiC power devices, for which research and development are being actively carried out, can mainly be divided into two classes: MOS devices and junction devices. The present invention relates to a performance improvement in static induction transistors (SIT), junction field effect transistors (JFET), and other junction transistors.

Following are reported examples of SITs and JFETs in which SiC has been used.

Figure 11:
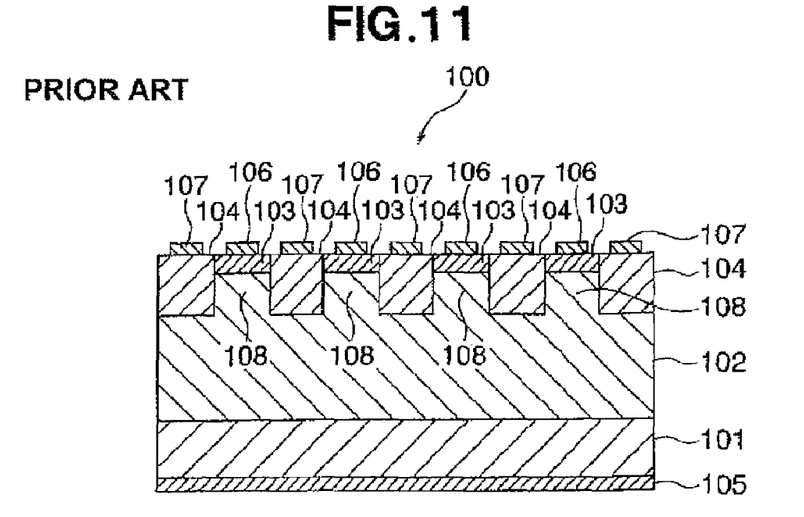
FIG. 11 is a cross-sectional schematic view of a conventional SIT.

Examples of a typical SIT have been disclosed in *600V5A 4H-SiC SIT with Low RonS of* 13 $m\Omega cm^2$ (Takashi Shinohe, and others, Proceedings of the Symposium on Static Induction Devices, Vol. 17, pp. 41-45) and 2002 *Report on the Results of Research Sponsored by New Energy and Industrial Technology Development Organization, Development of Ultra Low Loss Power Devices Technology, and Device Design Technology* (Research and Development Association for Future Electron Devices). FIG. 11 shows a cross-sectional schematic view of the SIT disclosed in *600V5A 4H-SiC SIT with Low RonS of* 13 $m\Omega cm^2$ by Takashi Shinohe, and others (Proceedings of the Symposium on Static Induction Devices, Vol. 17, pp. 41-45). The SIT 100 has a drain region 101 (an n-type low-resistance layer), a drift region 102 (an n-type high-resistance layer), source regions 103 of an n-type low-resistance region, gate regions 104 of a p-type low-resistance region formed so as to surround the source regions, a drain electrode 105, source electrodes 106, and gate electrodes 107. Channel regions 108 are formed between the gate regions 104. The SIT 100 does not have a channel-doped layer inside the drift region 102, and is a static induction transistor that exhibits a normally-on characteristic, which is in a conducting state when voltage is not applied to the gate electrodes 107. This is dependent on an FET (Field Effect Transistor) operation in which positive holes (which are minority carriers) are not injected into the channel region 108 from the gate region 104. It is for this reason that special contrivances are not required to inhibit recombination of electrons and positive holes in the surface between the gate and source.

Figure 12:
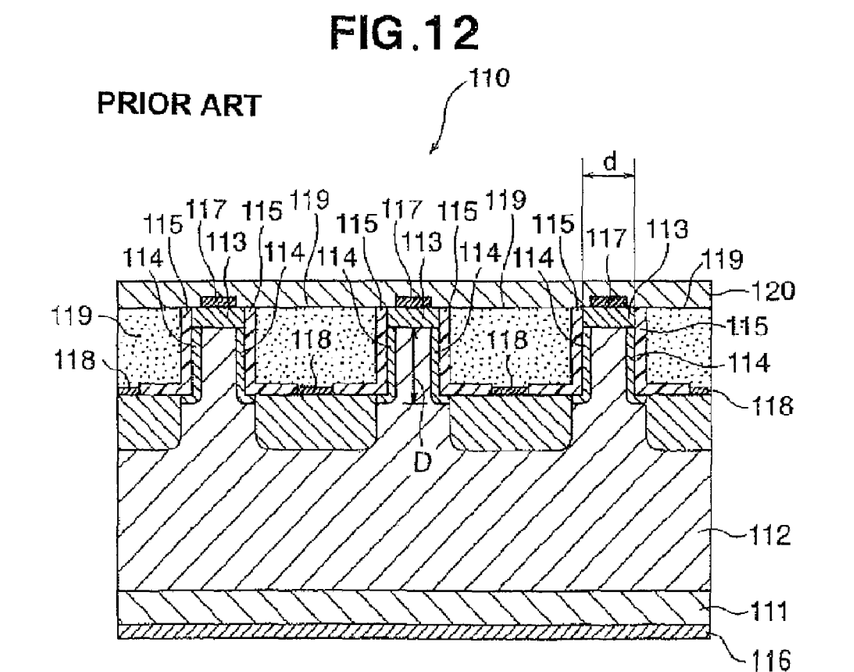
FIG. 12 is a cross-sectional schematic view of a conventional JFET.

An example of a JFET is disclosed in *6A, 1kV 4H-SiC Normally-off Trenched-and-Implanted Vertical JFETs* (J. H. Zhao, et al., Materials Science Forum Vols. 457-460 (2004), pp. 1213-1216). FIG. 12 shows a cross-sectional structural view of a JFET disclosed in the preceding reference. The JFET 110 has a drain region 111 (an n-type low-resistance layer), a drift region 112 (an n-type high-resistance layer), source regions 113 of an n-type low-resistance layer, a p-type low-resistance region, p-type low-resistance gate regions 114, passivation films 115, a drain electrode 116, source electrodes 117, gate electrodes 118, trench portions 119, and a source metal layer 120. The width d of the source of the JFET is very narrow in a range of 1.45 μm to 1.95 μm. The depth D of the channel region is considerable at 2.1 μm. Therefore, with this JFET, in order to set the normally-off characteristic (non-conductive state) when voltage is not applied to the gate electrode 118, the width of the source must be made less than 1.95 μm, and such a width is very difficult to produce. In order to reduce the resistance of the gate region 114, a material with a high concentration of impurities is selected.

Figure 13A:
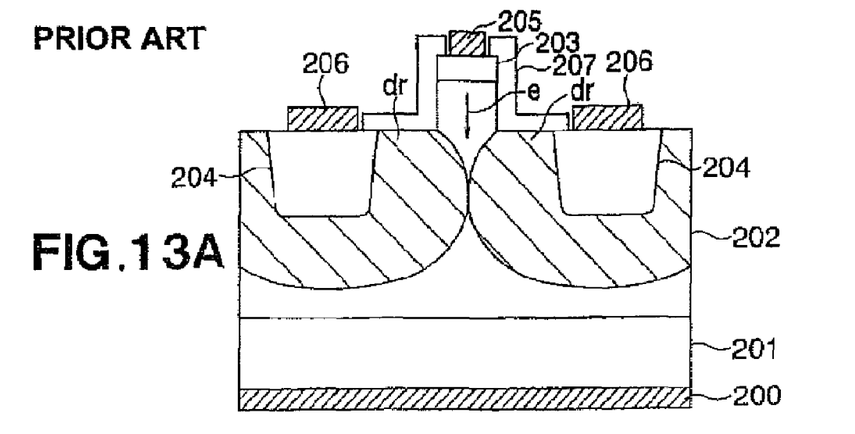
FIGS. 13A to 13C are views illustrating an operation of a typical conventional junction transistor.
Figure 13B:
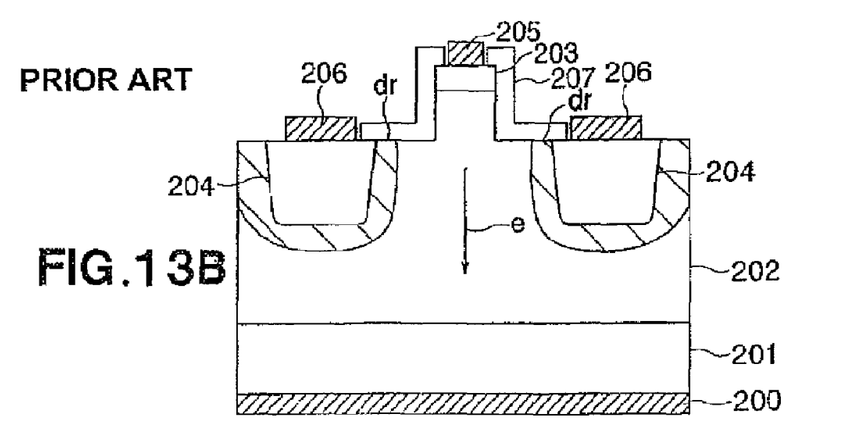
Figure 13C:
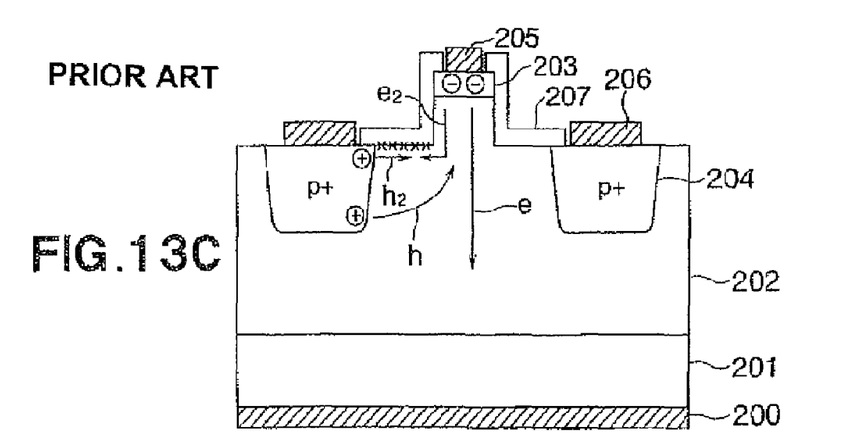

FIGS. 13A, 13B, and 13C are views that describe the operation of a typical junction transistor. In FIGS. 13A, 13B, and 13C, reference numeral 200 is a drain electrode, 201 is a drain region, 202 is a drift region, 203 is a source region, 204 is a gate region, 205 is a source electrode, 206 is a gate electrode, and 207 is a surface protective layer. In this junction transistor, a voltage is applied to the drain electrode 200, the source electrode 205 disposed on both surfaces of the substrate, and the main electric current that flows between the source and drain is controlled by signals applied to the gate electrode 206 disposed so as to surround the source region 203.

In this junction transistor, main electric current does not flow in a state in which an OFF signal is applied to the gate electrode 206. In the normally-on device described above, a negative voltage acting as an off signal must be applied to the gate electrode in order to switch the device off. When an OFF signal is presented to the gate region 204, a depletion region dr expands inside the drift region 202, and electrons (arrow e) can no longer travel from the source region 203 through the drift region 202, as shown in FIG. 13A. A negative voltage is applied in a normally-on transistor in order to achieve such a state (pinch off). Also, this state is ordinarily achieved at 0 V in a normally-off transistor. FIG. 13B shows the state in which a higher voltage than the voltage in the pinch-off state is applied to the gate electrode 206. When a voltage that is higher than the voltage in the pinch-off state is applied as the gate voltage, the depletion region dr is reduced, the transistor is set in an ON state, and an electron current (arrow e) flows from the source electrode 205 to the drain electrode 200. When the voltage applied to the gate electrode 206 is increased, positive holes are injected (arrow h) from the gate region 204 to the drift region 202, as shown in FIG. 13C. Electrons are injected from the source region 203 due to the positive hole injection, and the electrical conductivity of the drift region increases so that the positive electric charge created by the injection of positive holes in the n-type drift region is neutralized. The ON resistance is thereby further reduced.

Thus, it is effective to apply the positive voltage to the gate electrode and increase the electrons injected from the source region into the drift region in order to obtain a lower ON voltage (resistance). In this case, the pn junction formed between the gate and source is given a forward bias, and the positive-hole electric current flows from the gate electrode to the source electrode. In order to operate the SIT at high efficiency, more drain electric current is preferably controlled with less gate electric current. For this reason, the electric current amplification factor (=drain electric current/gate electric current) is an important parameter.

Considered next is the effect of the surface states between the gate and source on the characteristics. A large number of surface states caused by uncombined atoms is present in the surface of the semiconductor. Subjecting silicon to thermal oxidation makes it possible to create a silicon oxide film boundary with few interface states that do not adversely affect the device characteristics. With SiC, on the other hand, it is currently impossible to sufficiently reduce the interface states by using thermal oxidation, and heat treatment (POA: Post Oxidation Annealing) and other processes performed thereafter. For this reason, when a forward bias is applied to the gate electrode 206 to cause a junction transistor such as that shown in FIG. 13C to operate, the positive holes (arrow h2) injected from the gate region 204 and the electrons (arrow e2) injected from the source region 203 recombine via the recombination states (indicated by the symbol "x" in the drawing) of the surface of the SiC surface between the gate and source, and the electric current amplification factor is reduced.

Figure 14A:
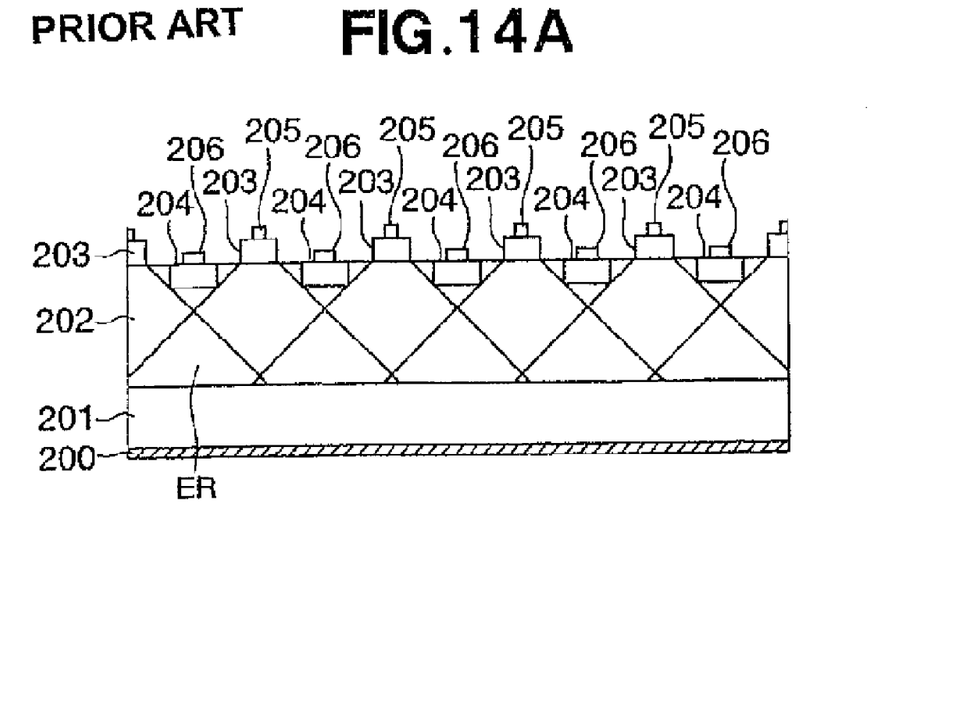
FIGS. 14A and 14B are views showing a comparison of a device having a narrow source and a device having a wide source.
Figure 14B:
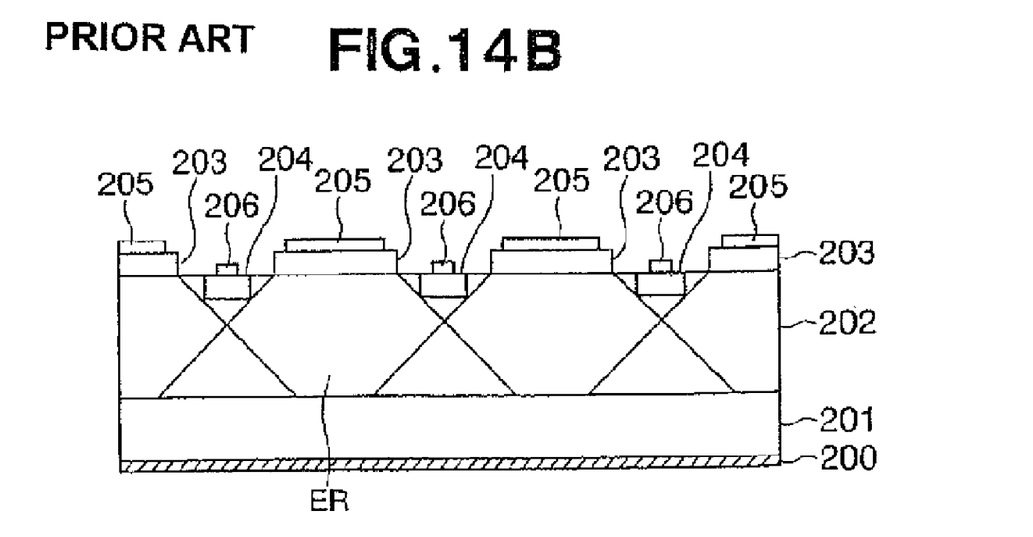

Described next is the normally-off characteristic. When some abnormality occurs and the control signal to the gate electrode is cut off in a power device, the device is preferably set in an OFF state. For this reason, it is an important condition that power devices have a normally-off characteristic. In order for the structure of FIG. 11 described above to have a normally-off characteristic, the distance between adjacent gates and the width of the source must be made very narrow. FIGS. 14A and 14B illustrate a comparison of a conventional device having a narrow source and a device having a wide source. FIG. 14A shows the case in which the source is narrow and FIG. 14B shows the case in which the source is wide. Reference numeral 200 is a drain electrode, 201 is a drain region, 202 is a drift region, 203 is a source region, 204 is a gate region, 205 is a source electrode, 206 is a gate electrode, and 207 is a surface protective film.

When the source is made narrow and the distance between the gates is reduced as in the device shown in FIG. 14A, manufacturing becomes difficult; the effective region (shown by reference symbol ER in the figure) of the entire device surface area is reduced, as shown in the view; and the ON voltage (resistance) increases as a result.

In the case of the SIT shown in FIG. 11, since a means is not provided for inhibiting the recombination of electrons and positive holes in the SiC surface between the source and gate, a considerable amount of recombination occurs in the SiC surface when a minority carrier is injected from the gate electrode, and the characteristics do not improve in a bipolar mode operation in which conductivity is modulated in the high-resistance layer between the drain and the source. Also, since channel doping is not adopted in the structure, it is very difficult to obtain a normally-off characteristic.

In order to obtain a normally-off characteristic in the case of the JFET shown in FIG. 12, a very small trench structure having a width of 1.5 μm and a depth of about 2 μm must be made, and a gate layer must also be provided to the side walls of the trench, resulting in difficult manufacture. Also, the percentage of the source region that occupies the device must be made smaller, which hinders improvement of the ON voltage (resistance).

There is a drawback in that when a forward bias is applied to the gate electrode to operate a conventional junction transistor, the positive holes injected from the gate region and the electrons injected from the source region recombine via the surface states of the SiC surface between the gate and source, and the electric current amplification factor is reduced.

In order to obtain a normally-off characteristic in a conventional junction transistor, the distance between adjacent gates and the width of the source must be made very narrow. When the width of the source is narrowed and the distance between gates is reduced, there is a drawback in that manufacturing becomes difficult, the effective region of the entire device surface area is reduced, and the ON voltage (resistance) increases as a result.

There is therefore a need to provide a junction semiconductor device and to establish a method for manufacturing a junction semiconductor device whose structure makes it possible to establish simple steps for manufacturing a high-performance junction device having a normally-off characteristic that is required in the motor control of automobiles and other applications.

SUMMARY OF THE INVENTION

According to a first aspect of the present invention, there is provided a junction semiconductor device comprising: a drain region comprising a low-resistance layer of a first conductive type formed on one surface of a semiconductor crystal; a source region comprising a low-resistance layer of a first conductive type formed on the other surface of the semiconductor crystal; a gate region of a second conductive type formed on the periphery of the source region; a high-resistance layer of a first conductive type between the source region and the drain region; and a recombination-inhibiting semiconductor layer of a second conductive type provided in the vicinity of the surface of the semiconductor crystal between the gate region and the source region.

In accordance with the present invention, a region (recombination-inhibiting semiconductor layer) of a conductive type that is the same as the gate region is disposed on the semiconductor surface between the gate and source. Since the electric potential is increased with respect to electrons of this region by providing a recombination-inhibiting semiconductor layer, the electrons injected from the source region are distanced from the semiconductor surface between the gate and source in which a large number of the surface states are present. For this reason, the likelihood of recombination in the surface states is reduced.

According to another aspect of the present invention, there is provided a junction semiconductor device comprising: a drain region comprising a low-resistance layer of a first conductive type formed on one surface of a semiconductor crystal; a source region comprising a low-resistance layer of a first conductive type formed on the other surface of the semiconductor crystal; a gate region of a second conductive type formed on the periphery of the source region; a high-resistance layer of a first conductive type between the source region and the drain region; and a recombination-inhibiting semiconductor layer of a first conductive type provided in the vicinity of the surface of the semiconductor crystal between the gate region and the source region.

In accordance with the present invention, a region (recombination-inhibiting semiconductor layer) of a conductive type that is the same as the source region is disposed on the semiconductor surface between the gate and source. Since the electric potential is increased with respect to positive holes of this region by providing a recombination-inhibiting semiconductor layer, the positive holes injected from the gate region are distanced from the semiconductor surface between the gate and source in which a large number of the surface states are present. For this reason, the likelihood of recombination in the surface states is reduced.

The junction semiconductor device preferably has a recombination-inhibiting film disposed on the surface of the semiconductor crystal between the gate region and the source region.

In the present invention, a recombination-inhibiting protective film is provided to reduce recombination on the semiconductor surface between the gate and source. The device characteristics can be further improved by incorporating a recombination-inhibiting semiconductor layer.

The junction semiconductor device preferably has a channel-doped layer of a second conductive type disposed within the high-resistance layer so as to be connected to the gate region.

In the present invention, a channel-doped layer is provided. Since the source width can be increased while maintaining normally-off characteristics by providing a channel-doped layer, the effective region of the device can be expanded and the ON voltage (resistance) can be reduced.

The semiconductor crystal may be silicon carbide.

The junction semiconductor device is preferably configured so that the depth of the recombination-inhibiting semiconductor layer from the surface of the semiconductor crystal is less than the depth of the gate region.

The junction semiconductor device is preferably configured so that the impurity concentration of the recombination-inhibiting semiconductor layer is lower than the impurity concentration of the gate region.

In this invention, since the positive hole concentration is not increased more than necessary by making the recombination-inhibiting semiconductor layer thin and reducing the impurity concentration with respect to the gate region, the likelihood of recombination in the surface states can be reduced.

According to yet another aspect of the present invention, there is provided a method for manufacturing a junction semiconductor device, which comprises the steps of: forming a high-resistance layer of a first conductive type on one surface of a semiconductor substrate of the first conductive type; forming a low-resistance layer of a first conductive type that acts as a source region on the high-resistance layer of a first conductive type; forming a gate region of a second conductive type at the periphery of the source region; forming a recombination-inhibiting semiconductor layer of a second conductive type in the vicinity of the surface of the high-resistance layer between the gate region and the source region; forming a recombination-inhibiting film on the semiconductor crystal surface between the gate region and the source region; joining a source electrode on the source region, a gate electrode on the gate region, and a drain electrode on the other surface of the semiconductor substrate; and forming an upper layer electrode above the source electrode and the gate electrode.

According to still another aspect of the present invention, there is provided a method for manufacturing a junction semiconductor device, which comprises the steps of: forming a high-resistance layer of a first conductive type on one surface of a semiconductor substrate of the first conductive type; forming a low-resistance layer of a first conductive type that acts as a source region on the high-resistance layer of a first conductive type; forming a gate region of a second conductive type at the periphery of the source region; forming a recombination-inhibiting semiconductor layer of a first conductive type in the vicinity of the surface of the high-resistance layer between the gate region and the source region; forming a recombination-inhibiting film on the semiconductor crystal surface between the gate region and the source region; joining a source electrode on the source region, a gate electrode on the gate region, and a drain electrode on the other surface of the semiconductor substrate; and forming an upper layer electrode above the source electrode and the gate electrode.

Preferably, the method further comprises the step of forming a channel-doped layer of a second conductive type midway through the high-resistance layer formation step.

BRIEF DESCRIPTION OF THE DRAWINGS

Certain preferred embodiments of the present invention will be described in detail below, by way of example only, with reference to the accompanying drawings, in which.

DESCRIPTION OF THE PREFERRED EMBODIMENTS

Figure 1:
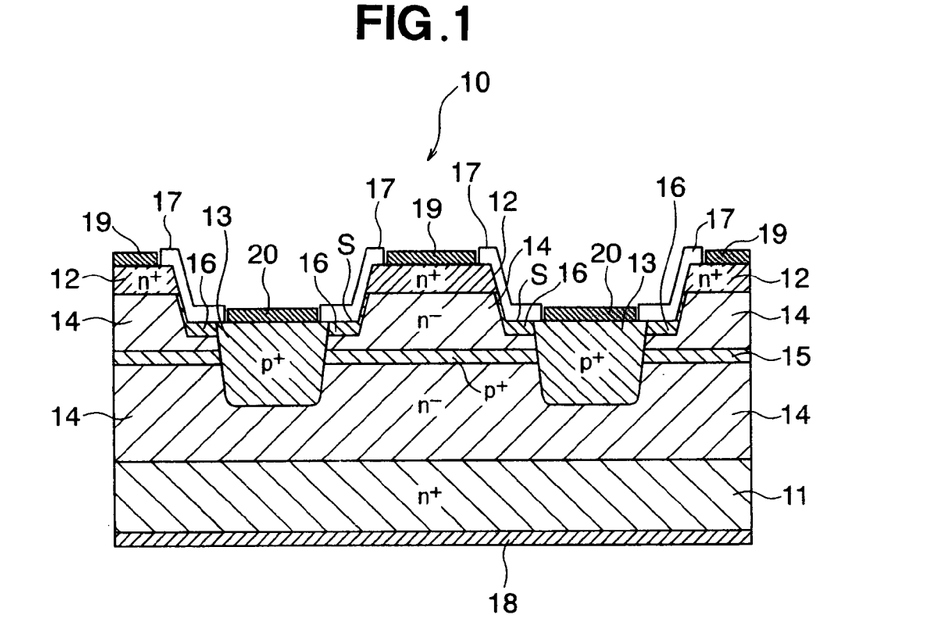
FIG. 1 is a partial cross-sectional view of a junction semiconductor device (static induction transistor (SIT) as an example) according to a first embodiment of the present invention.
Figure 2:
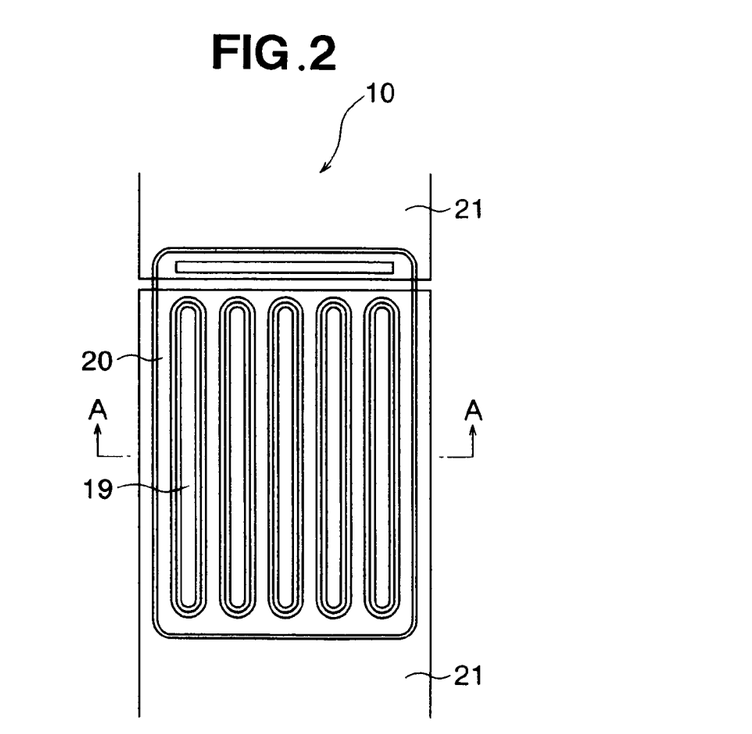
FIG. 2 is a top plan view of the junction semiconductor.

Reference is initially made to FIG. 1 showing in partial cross-section a junction semiconductor device according to a first embodiment of the present invention, and to FIG. 2 showing the same in top plan. More specifically, FIG. 2 shows an example static induction transistor (SIT) having five source electrodes while FIG. 1 is an enlarged view of the structure of a single source electrode taken along line A-A of FIG. 2. Disposed in a static induction transistor 10 are a drain area 11 composed of an n-type (first conductive type) low-resistance layer (n⁺ layer) formed on one surface of a silicon carbide (SiC) crystal, a source region 12 composed of an n-type low-resistance layer (n⁺ layer) formed on the other surface of the SiC crystal, a p-type (second conductive type) gate region 13 formed around the periphery of the source region 12, an n-type high-resistance layer (n⁻ layer) 14 disposed between the source region 12 and the drain region 11, and a p-type channel-doped layer 15 disposed so as to be connected to the gate region 13 inside the n-type high-resistance layer 14. In the static induction transistor 10, a p-type recombination-inhibiting semiconductor layer 16 is disposed in the vicinity of the surface of the SiC crystal between the gate region 13 and source region 12. In the static induction transistor 10, a recombination-inhibiting film 17 is furthermore disposed on the surface of the SiC crystal between the gate region 13 and source region 12. A drain electrode 18 that is joined to the drain region 11, a source electrode 19 that is joined to the source region 12, and a gate electrode 20 that is joined to the gate region 13 are also provided in the static induction transistor 10. FIG. 2 shows an upper layer electrode 21 disposed in the upper portion of the source electrode 19 and gate electrode 20.

In the static induction transistor 10, the depth of the recombination-inhibiting semiconductor layer 16 from the surface S of the SiC crystal is formed so as to be less than the depth from the surface S of the gate region 13. Also, the impurity concentration of the recombination-inhibiting semiconductor layer 16 is formed so as to be lower than the impurity concentration of the gate region 13.

Figure 3A:
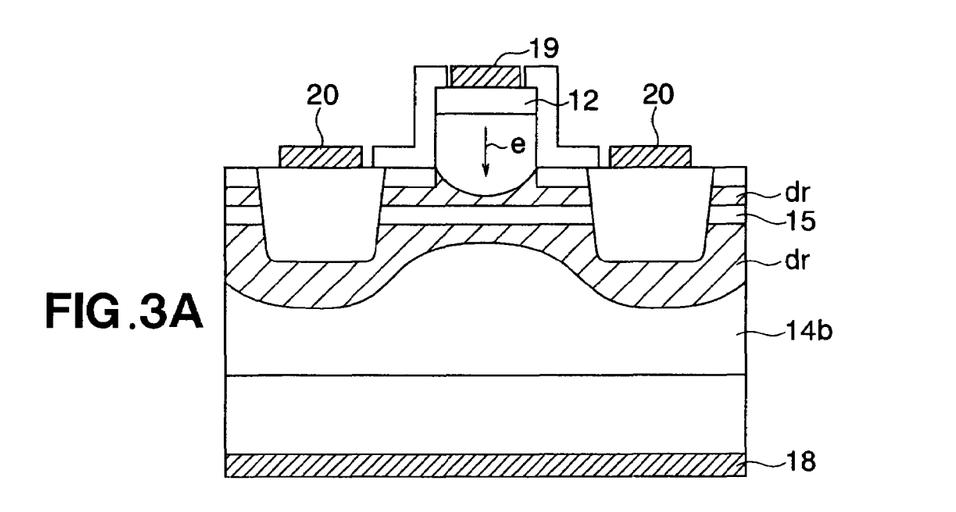
FIGS. 3A to 3C are views illustrating an operation of the junction semiconductor device, FIG. 3A showing a state in which voltage that is equal to or less than the pinch-off voltage is applied to the gate electrode, FIG. 3B showing a state in which voltage that is equal to or greater than the pinch-off voltage is applied to the gate electrode, and FIG. 3C showing a state in which even higher voltage is applied to the gate electrode.
Figure 3B:
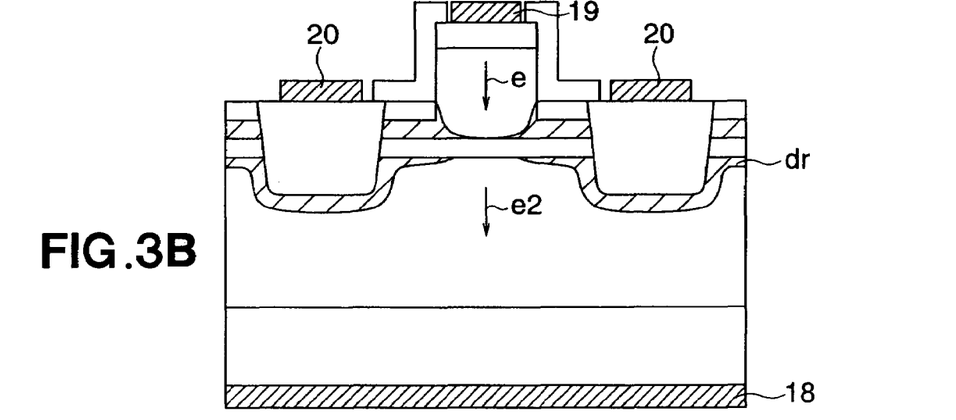
Figure 3C:
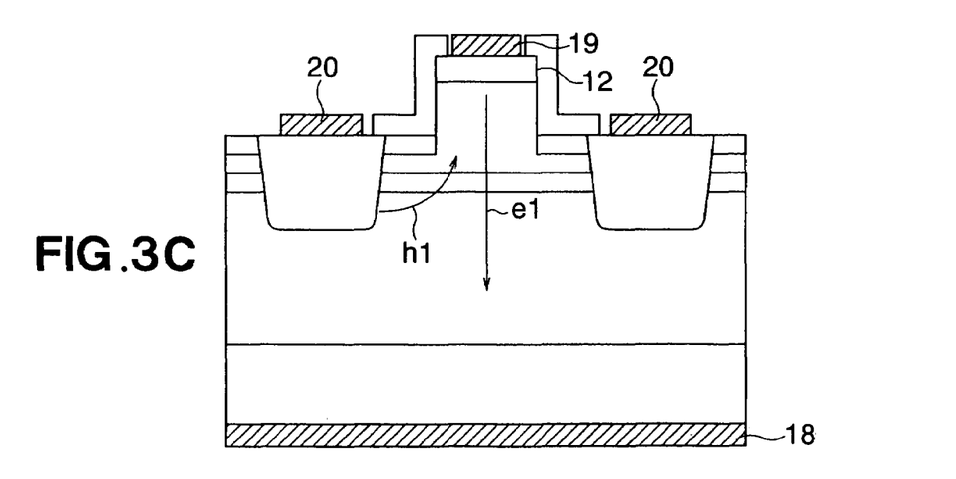

FIGS. 3A, 3B, and 3C are views showing the operation of the static induction transistor of the present embodiment. FIG. 3A shows the state in which a drain voltage VD is applied between the source electrode 19 and drain electrode 18, and a voltage that is equal to or less than the pinch-off voltage is applied to the gate electrode 20 in the static induction transistor 10. In this case, the depletion region dr inside the drift region 14b of the gate region 13 expands, and since the electric potential of the channel-doped layer 15 is high, the electrons (arrow e) from the source region 12 are obstructed by the barrier of the depletion region dr and the channel-doped layer 15, and do not flow through the drift region 14b. Conversely, when a voltage that is equal to or greater than the pinch-off voltage is applied to the gate electrode 20, as shown in FIG. 3B, the depletion region dr narrows, the electric potential of the channel-doped layer 15 is reduced, and electrons (arrow e2) flow between the source electrode 19 and drain electrode 18, resulting in the flow of electric current. When voltage is further applied to the gate electrode 20 as shown in FIG. 3C, positive holes are injected (arrow h1) from the gate region 13 into the drift region 14b. Electrons (arrow e1) are thereby injected from the source region 12 so as to satisfy the electric charge neutralization condition, and the high-resistance layer is conductively modulated. The ON resistance is also thereby reduced. Electrons and positive holes are believed to flow therethrough.

In the conventional structure shown in FIGS. 13A, 13B, and 13C, applying a voltage causes electrons from the source region and positive holes from the gate region to recombine, and if a greater amount of positive hole electric current does not flow from the gate electrode, the ON state cannot be maintained. It is for this reason that the electric current amplification factor is reduced. However, the structure of the present invention has a recombination-inhibiting semiconductor layer 16 and recombination-inhibiting film 17, as shown in FIG. 1. It therefore becomes difficult for the positive holes from the gate region and electrons from the source region to come in proximity because of the layer, and recombination is inhibited. As a result, positive hole recombination is reduced and the electric current amplification factor is increased.

Since the electric potential with respect to the electrons of the region is increased by providing a recombination-inhibiting semiconductor layer, the electrons injected from the source region are distanced from the semiconductor surface between the gate and source in which a large number of surface states is present. Also, the density of positive holes is reduced by making the recombination-inhibiting semiconductor layer thinner and decreasing the impurity concentration with respect to the gate region, and the likelihood of recombination in the surface states can be reduced as a result. In the present invention, a recombination-inhibiting protective layer that reduces recombination is disposed on the surface of the semiconductor between the gate and source, and the device characteristics can be further improved by combining the protective layer with a recombination-inhibiting semiconductor layer. Also, in the present invention, the distance between adjacent gates and the source width can be increased while maintaining the normally-off characteristic by providing a channel-doped layer. For this reason, manufacture can be made simple, the effective region of the entire surface area of the device can be expanded, and, as a result, the ON voltage (resistance) can be successfully inhibited.

Next, the structure of a junction semiconductor device manufactured in accordance with the first embodiment of the present invention (using a static induction transistor (SIT) as an example) is described with reference to FIG. 1. FIG. 1 shows an SIT that is designed with a blocking voltage of 600 V as an embodiment. A low-resistance n-type 4H—SiC substrate that is offset by 8° from the (0001) surface is used as the substrate, and in the present SIT, this substrate acts as the drain region 11. The n-type high-resistance layer 14 on the substrate is a layer for blocking high voltage between the source and the drain, and in the present embodiment, the thickness is set to 10 μm and the impurity concentration is set to $1\times10^{16}$ cm$^{-3}$ so that voltage that is 600 V or higher is blocked. The p-type channel-doped layer on the high-resistance layer is designed with a thickness and impurity concentration that do not allow the transistor to become switched on even when the voltage $V_{GS}$ between the gate and source is 0 V when a high voltage is applied between the source and drain. In the present embodiment, the thickness is set to between 0.1 μm and 0.5 μm, and the impurity concentration is set to between $2\times10^{17}$ and $4\times10^{19}$ cm$^{-3}$. Disposed on the channel-doped layer is a low-resistance n-type source region that has a thickness of 0.2 to 0.4 μm and an impurity concentration of 1 to $5\times10^{19}$ cm$^{-3}$ and is sandwiched between high-resistance layers that have a thickness of 0.2 to 0.4 μm and an impurity concentration of $1\times10^{16}$ cm$^{-3}$. A low-resistance p-type gate region that has a thickness of 2 μm and an impurity concentration of about $1\times10^{19}$ cm$^{-3}$ is disposed about the periphery of the source region. The source electrode has a long narrow insular shape, and a plurality of the source electrodes are provided in a single device, as shown in FIG. 2. A single source electrode is approximately 3 to 10 μm in width and 100 to 1,000 μm in length. The cycle of a unit device that includes the gate region and source region is about 10 to 30 μm.

Figure 4A:
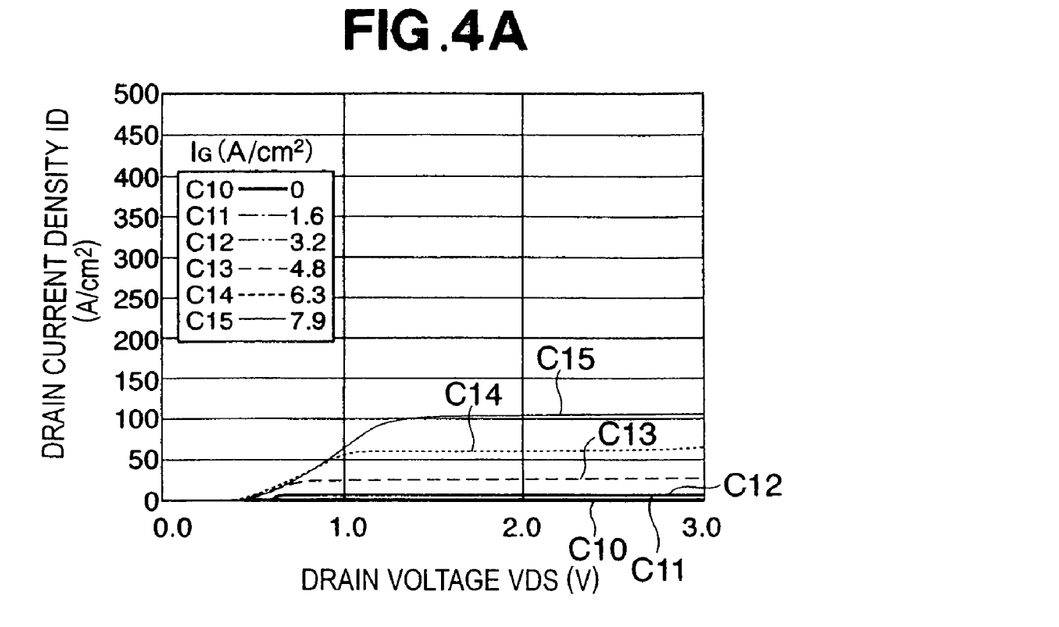
FIG. 4A is a graph showing the electric current-voltage characteristics of an SIT in the case in which a recombination-inhibiting layer is not present.
Figure 4B:
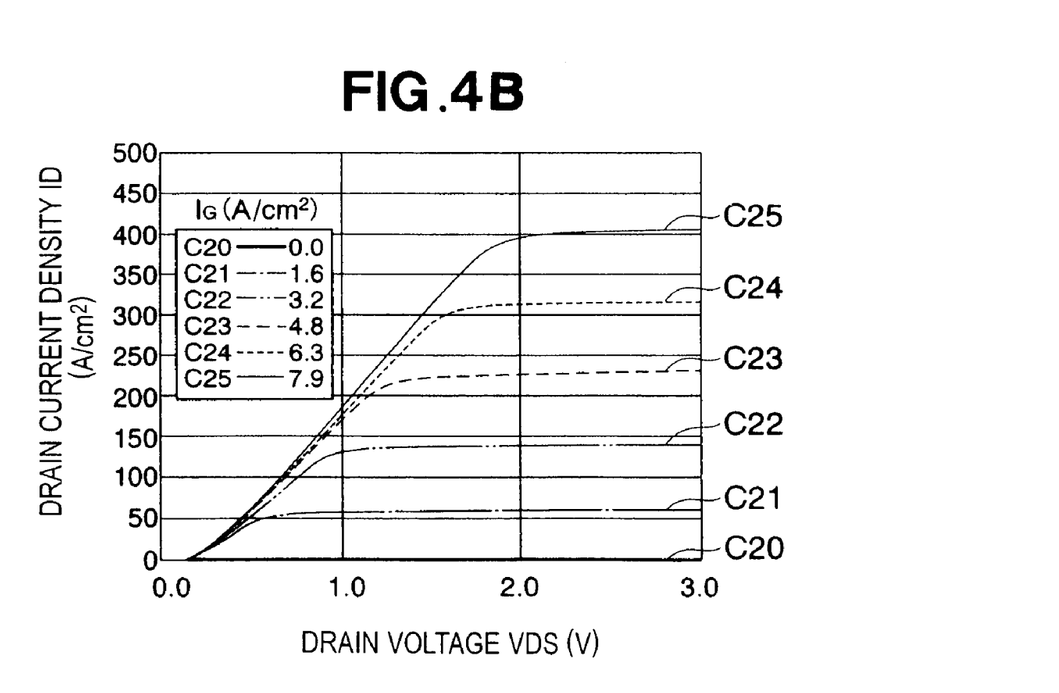
FIG. 4B is a graph showing the electric current-voltage characteristics of an SIT in the case in which a recombination-inhibiting layer is present.

FIG. 4 shows the electric current-voltage characteristics of the SIT in the first embodiment, and the characteristics of an SIT that has been fabricated without using the present invention. The characteristic values of both these configurations are summarized in the following table.

TABLE 1

| RECOMBINATION-INHIBITING LAYER | ELECTRIC CURRENT AMP. FACTOR $V_{ds} = 3\,V, I_G = 7.9\,A/cm^2$ | ON VOLTAGE $I_c = 100\,A/cm^2$ |
| --- | --- | --- |
| NONE | 14 | 1.3 |
| PRESENT | 51 | 0.7 |

The difference between the two is the presence or absence of a recombination-inhibiting layer, and the device structure and manufacturing steps are the same. FIG. 4A shows the electric current-voltage characteristics of an SIT that does not have a recombination-inhibiting layer, and FIG. 4B shows the electric current-voltage characteristics of a transistor in the present invention provided with a recombination-inhibiting layer (*1) and fabricated under the above-described conditions. The horizontal axis shows the drain voltage, and the vertical axis shows the drain electric current density. The curves C10, C11, C12, C13, C14, and C15 are the electric current-voltage characteristics in which the gate current is 0, 1.6, 3.2, 4.8, 6.3, and 7.9 (A/cm$^2$), respectively; and the curves C20, C21, C22, C23, C24, and C25 are the electric current-voltage characteristics in which the gate current is 0, 1.6, 3.2, 4.8, 6.3, and 7.9 (A/cm$^2$), respectively. From these electric current-voltage characteristics, the electric current amplification factor and ON voltage were 14 and 1.3, respectively, as shown in TABLE 1, when a recombination-inhibiting layer was not used. When a recombination-inhibiting layer (*2) was used, the electric current amplification factor and ON voltage were 51 and 0.7, respectively. It is apparent that both the electric current amplification factor and the ON voltage are considerably improved by introducing a recombination-inhibiting layer. Also, SITs having various structures were compared, and it was confirmed that the average increase in the electric current amplification factor was about 300%.

Figure 5:
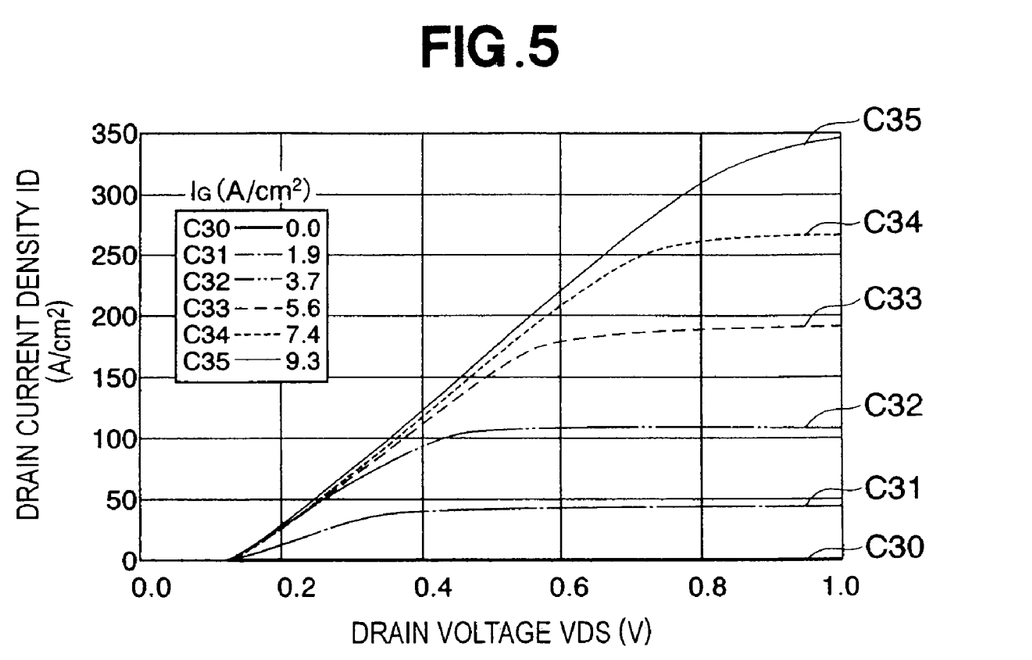
FIG. 5 is a graph showing the electric current-voltage characteristics of a junction semiconductor device with particularly good ON voltage characteristics among the SITs fabricated in the invention.

FIG. 5 is a view showing the electric current-voltage characteristics of a device having particularly good ON voltage characteristics among the SITs fabricated. The horizontal axis shows the drain voltage, and the vertical axis shows the drain electric current density. The curves C30, C31, C32, C33, C34, and C35 are the electric current-voltage characteristics in which the gate current is 0, 1.9, 3.7, 5.6, 7.4, and 9.3 (A/cm$^2$), respectively. From the electric current-voltage characteristics, the ON resistance was 2.8 mΩcm$^2$ at a drain electric current density of 200 A/cm$^2$, and the ON resistance was 2.6 mΩcm$^2$ at a drain electric current density of 300 A/cm$^2$. These are the highest publicly known values obtained in an SiC device having a withstand voltage of 600 V or higher.

Figure 6:
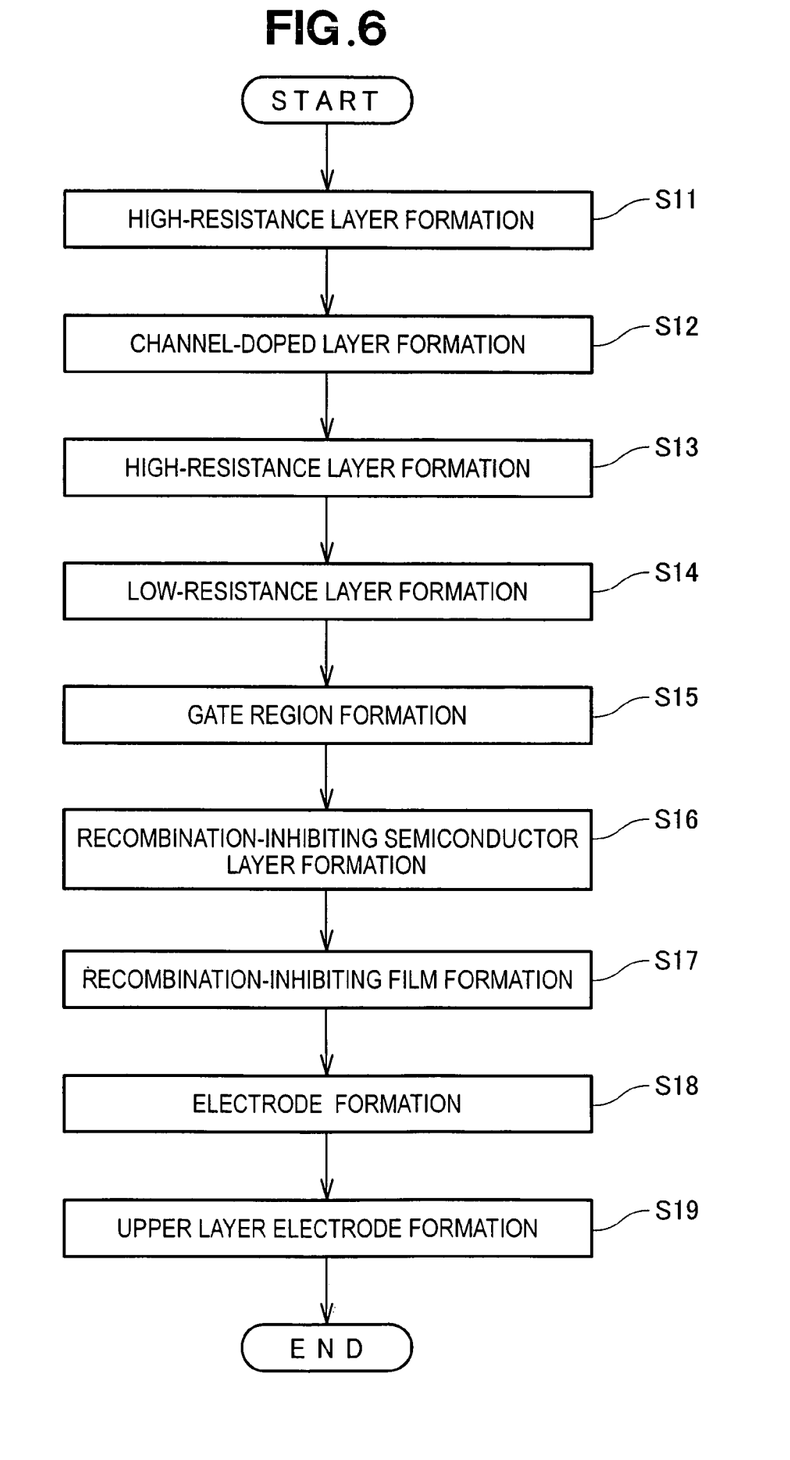
FIG. 6 is a flowchart showing the steps for manufacturing a static induction transistor by the junction semiconductor device manufacturing method according to the first embodiment of the invention.

Described next is the method for manufacturing the junction semiconductor (using SIT as an example) of the first embodiment of the present invention. FIG. 6 is a flowchart showing the steps for manufacturing a static induction transistor (SIT) by the method for manufacturing a junction semiconductor device of the first embodiment of the present invention. FIGS. 7A to 7D and FIGS. 8A to 8D are structural cross-sectional views of each step. The method for manufacturing a junction semiconductor device includes the following steps: a step for forming a high-resistance layer of a first conductive type on a semiconductor substrate of a first conductive type (step S11); a step for forming a channel-doped layer of a second conductive type (step S12); a step for forming a high-resistance layer of a first conductive type (step S13); a step for forming a low-resistance layer of a first conductive type that acts as a source region (step S14); a step for forming a gate region of a second conductive type (step S15); a step for forming a recombination-inhibiting semiconductor layer of a second conductive type in the vicinity of the surface of the high-resistance layer between the gate region and the source region (step S16); a step for forming a recombination-inhibiting film on the surface of the semiconductor crystal between the gate region and the source region (step S17); an electrode formation step for forming a source electrode, a gate electrode, and a drain electrode (step S18); and a step for forming an upper layer electrode on the source electrode and gate electrode side (step S19).

Figure 7A:
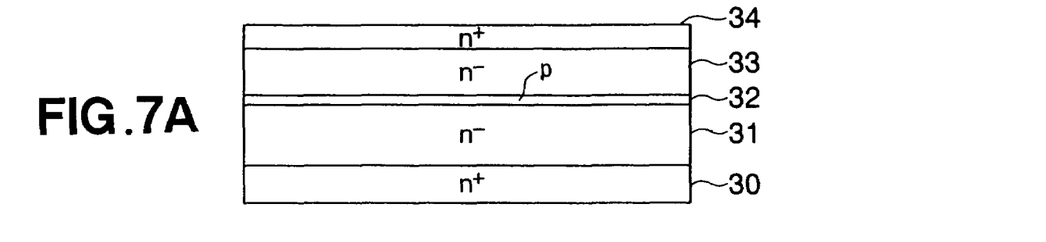
FIGS. 7A to 7D are cross-sectional views illustrating a semiconductor substrate in the steps for manufacturing a static induction transistor by the junction semiconductor device manufacturing method according to the first embodiment of the invention.

In the step for forming a high-resistance layer (step S11), an SiC layer 31 doped with nitrogen as an impurity (concentration: $1\times10^{16}\,cm^{-3}$) is grown to a thickness of 10 µm on an SiC high-density n-type substrate 30 by using epitaxial growth. Next, in the step for forming a channel-doped layer (step S12), SiC 32 is grown to a thickness of 0.1 to 0.5 µm with aluminum as an impurity (concentration: $1\times10^{17}$ to $1\times10^{19}\,cm^{-3}$) by using epitaxial growth. In the step for forming a high-resistance layer (step S13), an SiC layer 33 doped with nitrogen as an impurity (concentration: $1\times10^{16}\,cm^{-3}$) is thereafter epitaxially grown to a thickness of 0.2 to 0.5 µm. In the step for forming a low-resistance layer (step S14), an SiC layer 34 doped with nitrogen as an impurity (concentration: 1 to $5\times10^{19}\,cm^{-3}$) is thereafter epitaxially grown thereon to a thickness of 0.2 to 0.4 µm (FIG. 7A).

Figure 7B:
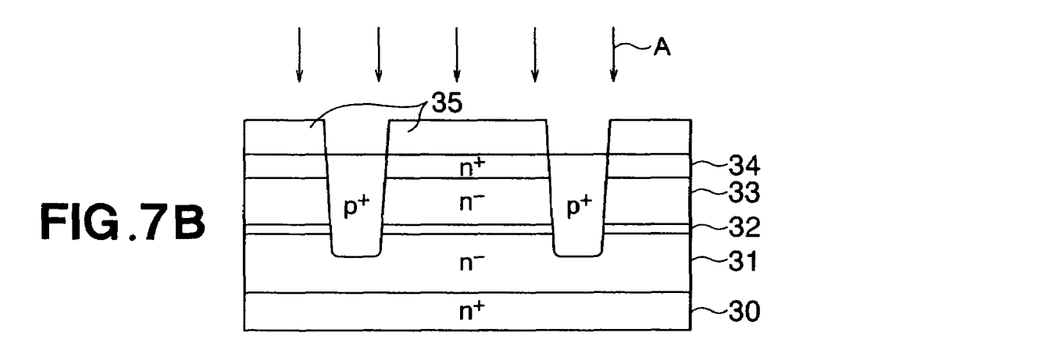

In the step for forming a gate region (step S15), a p-type gate region G is formed by selective ion implantation. In FIG. 7B, first, an ion implantation mask 35 is formed for protecting the region on whose surface the gate region will not be formed.

A CVD (chemical vapor deposition) silicon oxide film or metal may be used as the mask material.

In the photolithography step, a resist is applied and the ion-implantation areas of the resist are then removed. In this step, the photoresist forms a mask in which the areas for forming the gate regions are open. The mask material of the regions in which ions will be implanted is etched away by reactive ion etching (RIE) or the like to form the mask. Thus, an ion implantation mask is formed, and ion implantation is thereafter carried out in order to form gate regions (arrow A in the figure).

Aluminum is used as the ion type for ion implantation from the surface, for example. Multistage implantation using a plurality of energy levels with a maximum implantation energy of 2 MeV or more is carried out in order to obtain a gate region depth of about 2 µm. The implantation amount is designed so that the impurity concentration is about $1\times10^{18}$ to $1\times10^{19}\,cm^{-3}$. After implantation, the ion implantation mask 35 is removed.

Figure 7C:
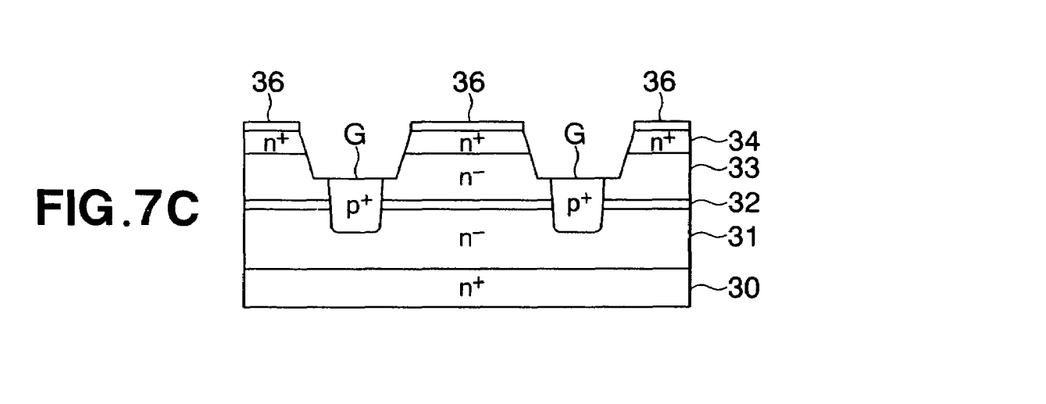

Performed next is the etching step for separating the source regions (FIG. 7C). A resist pattern is formed in the photolithography step by using CVD silicon oxide film as the etching mask, the CVD silicon oxide film is thereafter etched using RIE or the like, and the SiC is then etched, with the CVD silicon oxide film acting as the mask 36. RIE or the like in which SF$_6$ or the like is used may be used to etch the SiC. The etching depth is about 0.3 to 0.6 µm.

Figure 7D:
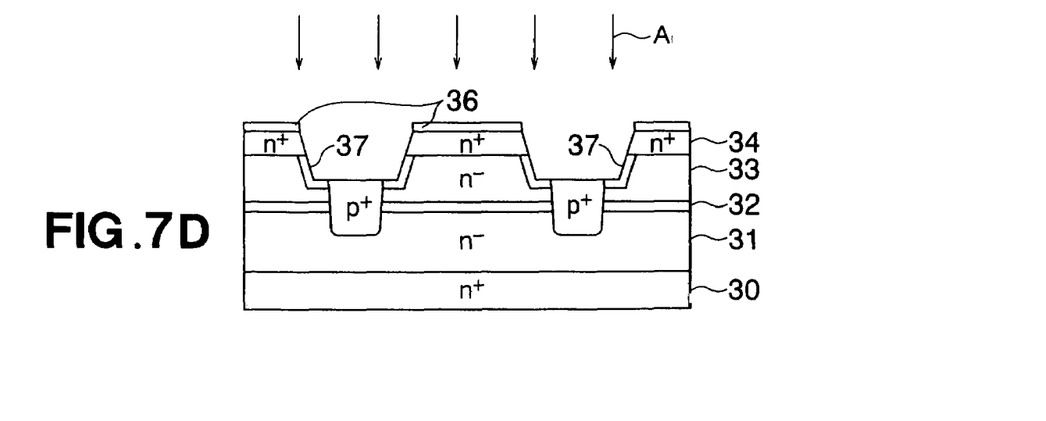

In the step for forming a recombination-inhibiting semiconductor layer, the source region is separated, after which ion implantation is carried out to form a recombination-inhibiting semiconductor layer 37 (FIG. 7D). In this case, a new photolithographic step is not required because a CVD silicon oxide film, which is the etching mask used in etching to separate the source region, is used as an ion implantation mask. The design entails using aluminum as the ion type, an implantation energy of several tens of kiloelectronvolts, and an implantation amount that produces an impurity concentration of $1\times10^{16}$ to $1\times10^{17}$ cm$^{-3}$. The p-type region does not have a function as a gate region, and the object is to distance the electrons from the source region. Also, since the concentration of holes is preferably low, the implantation amount and implantation energy can both be set to a low level in comparison with gate ion implantation. For this reason, adverse effects of the process on the device characteristics can be inhibited because damage to the crystal by ion implantation can be kept low.

Figure 8A:
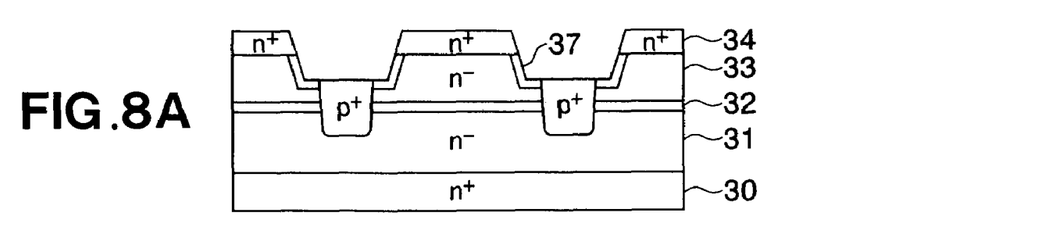
FIGS. 8A to 8D are cross-sectional views illustrating a semiconductor substrate in the steps for manufacturing a static induction transistor by the junction semiconductor device manufacturing method according to the first embodiment of the invention.
Figure 8B:
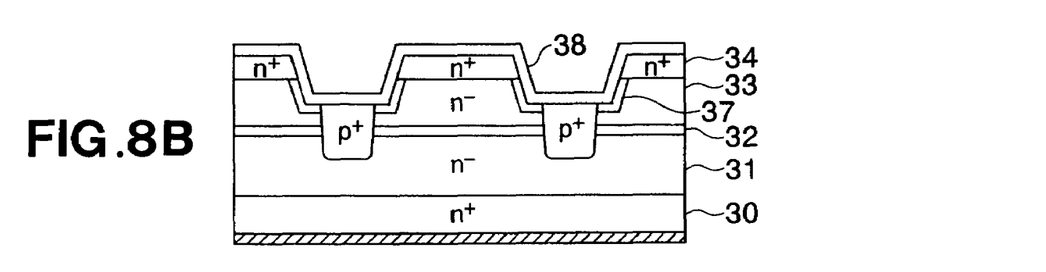

After ion implantation, the implanted ions are electrically activated in the semiconductor, and activation heat treatment is carried out to remove the crystal defects produced by ion implantation (FIG. 8A). In the present embodiment, implantation of ions into the gate and implantation of ions into the recombination-inhibiting semiconductor layer are both simultaneously activated. Heat treatment is carried out for about 10 minutes at a high temperature of about 1,700 to 1,800° C. using a high frequency heat treatment furnace, or the like. Argon is used as atmospheric gas.

In the step for forming a recombination-inhibiting protective layer 38 (S17), sacrificial oxidation that removes the oxide film after thermal oxidation is first carried out to remove the surface layer formed in the ion implantation and activation heat treatment steps, as shown in FIG. 8A. The oxidation conditions include a temperature of 1,100° C. for 20 hours in dry oxygen, for example. Hydrogen fluoride is used to remove the oxide film. Sacrificial oxidation is performed and thermal oxidation is thereafter carried out again to form an oxide film. Heat treatment (POA: Post Oxidation Annealing) is thereafter carried out to reduce the impurity level of the SiC oxide film interface. POA is carried out at a high temperature of about 800 to 1,300° C. in a hydrogen or nitrogen oxide (NO, N$_2$O) atmosphere or in an argon atmosphere. After POA, a CVD oxide film or a CVD nitride film is formed.

Figure 8C:
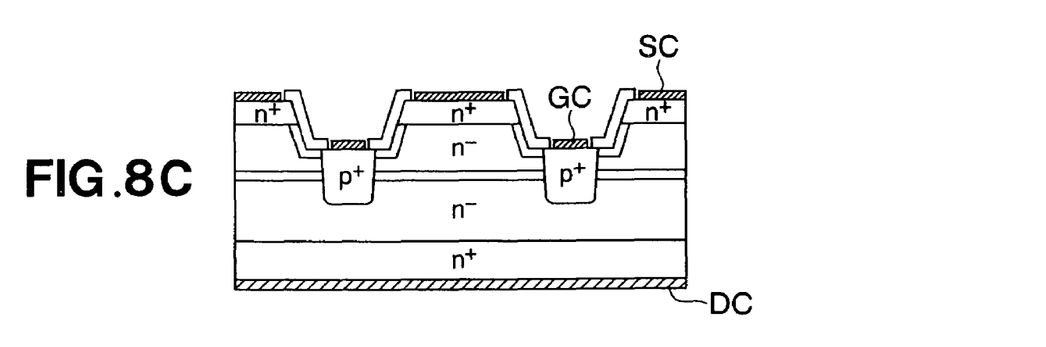

After the above process has been completed, electrodes SC, GC, and DC are formed on the source regions, gate regions, and drain regions (FIG. 8C). Nickel or titanium is used as the source and drain electrodes, and titanium, aluminum, or the like is used as the gate electrode. The electrodes are formed by vapor deposition, sputtering, or the like; and dry etching, wet etching, lift-off, or another method may be used together with the photolithography step to form a pattern. Also, after electrodes have been formed, heat treatment is carried out to reduce the contact resistance of the metal and semiconductor. The conditions are a temperature of 800 to 1,000° C. for about 10 to 30 minutes.

Figure 8D:
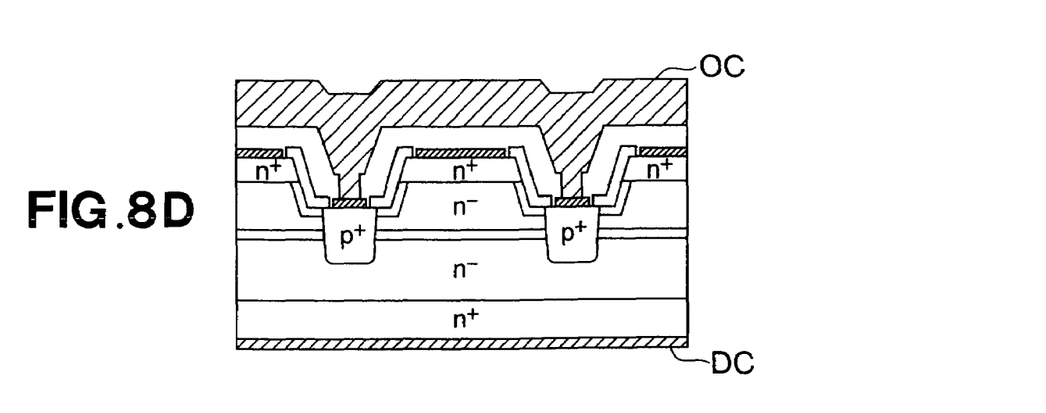

Lastly, an upper layer wiring step is carried out to bring out the separated source electrodes to a single electrode (FIG. 8D). After a CVD oxide film or the like is formed as an interlayer film, the CVD oxide film or the like of the source electrode portion is removed by photolithography and etching to expose the source electrodes, and an upper layer electrode OC is thereafter deposited. Aluminum is used as the electrode material.

The high-performance SIT having a normally-off characteristic shown in FIGS. 1 and 2 can be fabricated in this manner.

Described in the embodiment above is the case in which the recombination-inhibiting semiconductor layer 16 shown in FIG. 1 is a p-type layer, but the layer may be an n-type layer. In this case, the positive holes are distanced by the same principle as the embodiment described above, and recombination is inhibited.

Figure 9:
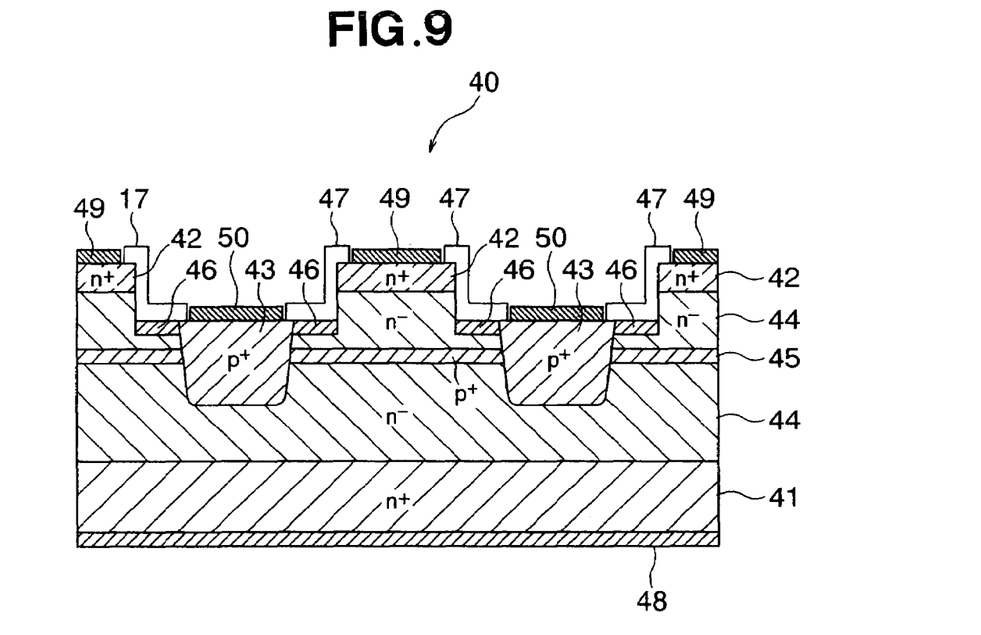
FIG. 9 is a cross-sectional view illustrating the junction semiconductor device according to a second embodiment of the invention.

FIG. 9 is a cross-sectional view of the junction semiconductor device of the second embodiment of the present invention. Disposed in the junction semiconductor device are a drain area 41 composed of an n-type (first conductive type) low-resistance layer (n$^+$ layer) formed on one surface of a silicon carbide (SiC) crystal, a source region 42 composed of an n-type low-resistance layer (n$^+$ layer) formed on the other surface of the SiC crystal, a p-type (second conductive type) gate region 43 formed around the periphery of the source region 42, an n-type high-resistance layer (n$^-$ layer) 44 disposed between the source region 42 and the drain region 41 (*3), and a p-type channel-doped layer 45 disposed so as to be connected to the gate region 43 inside the n-type high-resistance layer 44. In the static induction transistor 40, a p-type recombination-inhibiting semiconductor layer 46 is disposed in the vicinity of the surface of the SiC crystal between the gate region 43 and source region 42. In the static induction transistor 40, a recombination-inhibiting film 47 is furthermore disposed on the surface of the SiC crystal between the gate region 43 and source region 42. A drain electrode 48 that is joined to the drain region 41, a source electrode 49 that is joined to the source region 42, and a gate electrode 50 that is joined to the gate region 43 are also provided in the static induction transistor 40.

In the static induction transistor 40, the depth of the recombination-inhibiting semiconductor layer 46 from the surface S of the SiC crystal is less than the depth from the surface S of the gate region 43. Also, the impurity concentration of the recombination-inhibiting semiconductor layer 46 is lower than the impurity concentration of the gate region 43.

The point of difference with the first embodiment is that a recombination-inhibiting semiconductor region is formed only in a portion of the area between the source and gate. Differences can be seen in the stepped shape formed between the source and gate depending on the shape of the etching mask and the etching technique. Shown in the first embodiment were examples in which the cross-sectional shape of the etching mask is sloped and in which the SiC etching is isotropic. The second embodiment is an example of the case in which the cross-sectional shape of the etching mask is vertical and the SiC etching is also anisotropic. In this case, the stepped shape between the source and gate is nearly vertical. In such a state, when ions are vertically implanted in the substrate, the ions are not implanted in the vertical surfaces of the substrate. The recombination-inhibiting semiconductor region is also formed only on the surfaces parallel to the substrate. However, the recombination-inhibiting semiconductor region can also effectively function when formed only in a portion of the area between the gate and source.

Described in the embodiment above is the case in which the recombination-inhibiting semiconductor layer 46 shown in FIG. 9 is a p-type layer, but the layer may be an n-type layer.

Figure 10:
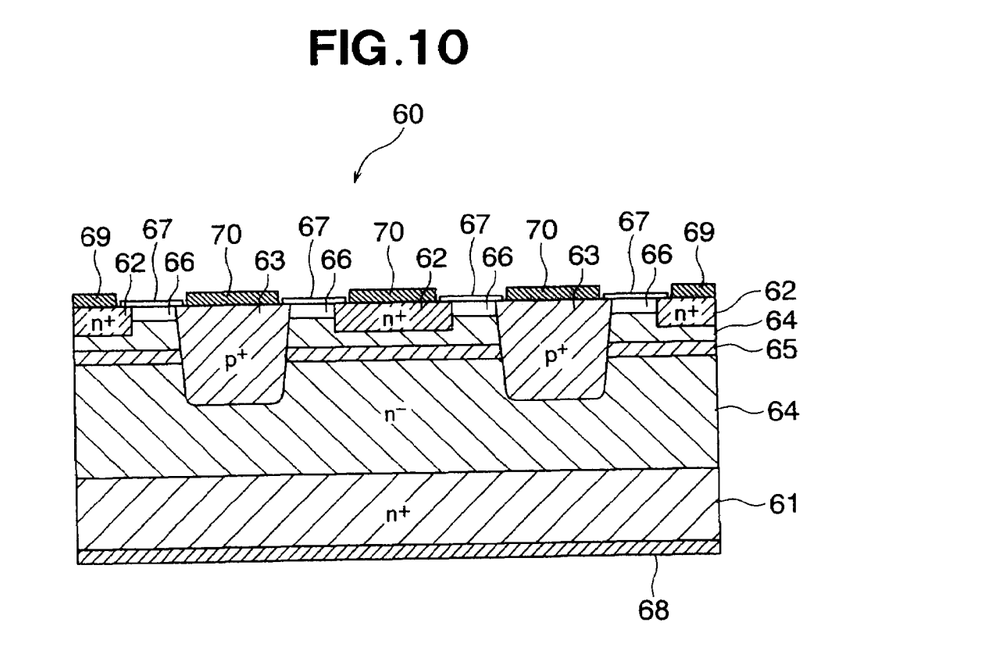
FIG. 10 is a cross-sectional view illustrating the junction semiconductor device according to a third embodiment of the invention.

FIG. 10 shows the third embodiment of the present invention. Disposed in the junction semiconductor device are a drain area 61 composed of an n-type (first conductive type) low-resistance layer (n$^+$ layer) formed on one surface of a silicon carbide (SiC) crystal, a source region 62 composed of an n-type low-resistance layer (n$^+$ layer) formed on the other surface of the SiC crystal, a p-type (second conductive type) gate region 63 formed around the periphery of the source region 62, an n-type high-resistance layer (n$^-$ layer) 64 disposed between the source region 62 and the drain region 61 (*4), and a p-type channel-doped layer 65 disposed so as to be connected to the gate region 63 inside the n-type high-resistance layer 64. In the static induction transistor 60, a p-type recombination-inhibiting semiconductor layer 66 is disposed in the vicinity of the surface of the SiC crystal between the gate region 63 and source region 62. In the static induction transistor 60, a recombination-inhibiting film 67 is furthermore disposed on the surface of the SiC crystal between the gate region 63 and source region 62. A drain electrode 68 that is joined to the drain region 61, a source electrode 69 that is joined to the source region 62, and a gate electrode 70 that is joined to the gate region 63 are also provided in the static induction transistor 60.

In the static induction transistor 60, the depth of the recombination-inhibiting semiconductor layer 66 from the surface S of the SiC crystal is less than the depth from the surface S of the gate region 63. Also, the impurity concentration of the recombination-inhibiting semiconductor layer 66 is lower than the impurity concentration of the gate region 63.

The third embodiment is an example in which the source region is not separated by etching, but is formed by selective ion implantation. In this case, the gate electrode and source electrode are formed on surfaces with the same height. In the present structure, since an etching step is not used, it is possible to further inhibit recombination of electrons and positive holes because the surface of the semiconductor is not damaged by etching, and the portion in which an electric field concentrates between the source electrodes is no longer present. Phosphorus or nitrogen may be used as the ion type in the source region.

Described in the embodiment above is the case in which the recombination-inhibiting semiconductor layer 66 shown in FIG. 10 is a p-type layer, but the layer may be an n-type layer.

The present invention as described above is different than a conventional junction transistor in that recombination of the minority carrier injected from the gate region and the majority carrier injected from the source region can be inhibited, the electric current amplitude factor can be improved, and the ON voltage (resistance) can be reduced because of the presence of a recombination-inhibiting semiconductor layer that is formed in the semiconductor region of the same conductivity type as the gate region on the surface of the semiconductor between the gate and source. Also, in the present invention, since a recombination-inhibiting protective film is disposed on the surface of the semiconductor between the gate and source in addition to the above-described recombination-inhibiting semiconductor layer, the electric current amplitude factor can be further improved. In the present invention, a low ON voltage (resistance) can be obtained with a relatively simple manufacturing method while maintaining the normally-off characteristic because a channel-doped layer is provided. The thicknesses of the layers, the amount of ion implantation energy, and other specific numerical values shown in the embodiment are no more than examples, and the numerical values may be suitably modified within the scope of implementing the present invention. In the present invention, the recombination-inhibiting film 17 and channel-doped layer 15 are not essential constituent elements, and also possible are configurations in which only one of the two is formed together with the recombination-inhibiting semiconductor layer 16, for example.

In the present embodiment, the P and N polarities in the description of the steps may be inverted, and the opposite polarity may be used. Also, an example of SiC was described in the present embodiment, but the present invention may also be applied to other semiconductors wherein surface recombination is a problem.

The present invention can be used in a high-performance junction semiconductor device and in the manufacture of such a high-performance junction semiconductor device.

Obviously, various minor changes and modifications of the present invention are possible in the light of the above teaching. It is therefore to be understood that within the scope of the appended claims the invention may be practiced otherwise than as specifically described.

What is claimed is:

1. A junction semiconductor device comprising:
a drain region comprising a low-resistance layer of a first conductivity type formed on one surface of a semiconductor crystal,
a source region comprising a low-resistance layer of a first conductivity type formed on another surface of said semiconductor crystal,
a gate region of a second conductivity type formed on a periphery of said source region,
a high-resistance layer of a first conductivity type between said source region and said drain region,
a recombination-inhibiting semiconductor layer of a second conductivity type provided in the vicinity of the surface of said semiconductor crystal between said gate region and said source region, so as to provide an increased electric field for one of minority carriers injected from the pate region and majority carriers injected from the source region, and thereby to distance said minority and said majority carriers, respectively, from said surface of said semiconductor crystal,
wherein said recombination-inhibiting semiconductor layer has an impurity concentration that is lower than an impurity concentration of said gate region.

2. A junction semiconductor device comprising:
a drain region comprising a low-resistance layer of a first conductivity type formed on one surface of a semiconductor crystal,
a source region comprising a low-resistance layer of a first conductivity type formed on another surface of said semiconductor crystal,
a gate region of a second conductivity type formed on a periphery of said source region,
a high-resistance layer of a first conductivity type between said source region and said drain region,
a recombination-inhibiting semiconductor layer of a first conductivity type provided in the vicinity of the surface of said semiconductor crystal between said gate region and said source region, so as to provide an increased electric field for one of minority carriers injected from the gate region and majority carriers injected from the source region, and thereby to distance said minority and said majority carriers, respectively, from said surface of said semiconductor crystal,
wherein said recombination-inhibiting semiconductor layer has an impurity concentration that is lower than an impurity concentration of said gate region.

3. The junction semiconductor device of claim 1 or 2, wherein a recombination inhibiting film is disposed on the surface of said semiconductor crystal between said gate region and said source region.

4. The junction semiconductor device of claim 1 or 2, wherein a channel-doped layer of a second conductivity type is disposed within said high-resistance layer so as to be connected to said gate region.

5. The junction semiconductor device of claim 1 or 2, wherein said semiconductor crystal is silicon carbide.

6. The junction semiconductor device of claim 1 or 2, wherein a depth of said recombination-inhibiting semiconductor layer from the surface of said semiconductor crystal is less than the depth of said gate region.

7. The junction semiconductor device of claim 2, wherein the impurity concentration of the recombination-inhibiting semiconductor layer is lower than an impurity concentration of the source region.

* * * * *